United States Patent
Forbes

(10) Patent No.: US 6,804,142 B2
(45) Date of Patent: Oct. 12, 2004

(54) 6F² 3-TRANSISTOR DRAM GAIN CELL

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/292,080

(22) Filed: Nov. 12, 2002

(65) Prior Publication Data
US 2004/0090816 A1 May 13, 2004

(51) Int. Cl.⁷ .................. G11C 11/24; H10L 27/108
(52) U.S. Cl. .................................. 365/149; 257/300
(58) Field of Search .................. 365/149; 257/300, 257/301, 302

(56) References Cited

U.S. PATENT DOCUMENTS

| | | | |
|---|---|---|---|
| 4,826,780 A | 5/1989 | Takemoto et al. | 437/37 |
| 4,970,689 A | 11/1990 | Kenney | 365/189.01 |
| 4,999,811 A | 3/1991 | Banerjee | 365/149 |
| 5,017,504 A | 5/1991 | Nishimura et al. | 437/40 |
| 5,021,355 A | 6/1991 | Dhong et al. | 437/35 |
| 5,042,011 A | 8/1991 | Casper et al. | 365/205 |
| 5,066,607 A | 11/1991 | Banerjee | 437/52 |
| 5,122,986 A | 6/1992 | Lim | 365/189.11 |
| 5,220,530 A | 6/1993 | Itoh | 365/189.01 |
| 5,280,205 A | 1/1994 | Green et al. | 307/530 |
| 5,308,783 A | 5/1994 | Krautschneider et al. | 437/52 |
| 5,378,914 A | 1/1995 | Ohzu et al. | 257/369 |
| 5,381,302 A | 1/1995 | Sandhu et al. | 361/305 |
| 5,385,853 A | 1/1995 | Mohammad | 437/41 |
| 5,414,288 A | 5/1995 | Fitch et al. | 257/328 |
| 5,448,513 A | 9/1995 | Hu et al. | 365/150 |
| 5,478,772 A | 12/1995 | Fazan | 437/60 |
| 5,506,166 A | 4/1996 | Sandhu et al. | 437/60 |
| 5,519,236 A | 5/1996 | Ozaki | 257/302 |
| 5,574,299 A | 11/1996 | Kim | 257/296 |
| 5,627,785 A | 5/1997 | Gilliam et al. | 365/189.01 |
| 5,707,885 A | 1/1998 | Lim | 437/52 |
| 5,719,409 A | 2/1998 | Singh et al. | 257/77 |
| 5,732,014 A | 3/1998 | Forbes | 365/149 |
| 5,854,500 A | 12/1998 | Krautschneider | 257/300 |
| 5,897,351 A | 4/1999 | Forbes | 438/242 |
| 5,909,618 A | 6/1999 | Forbes et al. | 438/242 |
| 5,936,274 A | 8/1999 | Forbes et al. | 257/315 |
| 5,959,327 A | 9/1999 | Sandhu et al. | 257/310 |
| 5,973,356 A | 10/1999 | Noble et al. | 257/319 |

(List continued on next page.)

FOREIGN PATENT DOCUMENTS

| | | | | |
|---|---|---|---|---|
| JP | 61-140170 | 6/1986 | | H01L/27/10 |
| JP | 5226661 | 9/1993 | | H01L/29/784 |

OTHER PUBLICATIONS

Mukai, M, et al., "Proposal of a Logic Compatible Merged–Type Gain Cell for High Density Embedded . . . ", *IEEE Transactions on Electron Devices*, (Jun. 1999), 1201–1206.

Adler, E., et al., "The Evolution of IBM CMOS DRAM Technology", *IBM Journal of Research & Developmen*, vol. 39 (1995), 167–168.

(List continued on next page.)

*Primary Examiner*—Trong Phan
(74) *Attorney, Agent, or Firm*—Schwegman, Lundberg, Woessner & Kluth, P.A.

(57) ABSTRACT

A high density vertical three transistor memory cell is provided. The high density vertical three transistor memory cell is formed in a vertical pillar. The vertical pillar includes a first vertical transfer device having a source region, a drain region, and a body region therebetween on a first side of the vertical pillar. The vertical pillar also includes a second vertical transfer device having a source region, a drain region, and a body region therebetween on a second side of the vertical pillar. A write data wordline opposes the first vertical transfer device. A read data wordline opposes the second vertical transfer device. A storage capacitor is coupled to the drain region of the first vertical transfer device. The storage capacitor further serves as a gate for a third transistor.

52 Claims, 8 Drawing Sheets

U.S. PATENT DOCUMENTS

| | | | | |
|---|---|---|---|---|
| 5,991,225 | A | 11/1999 | Forbes et al. | 365/230.06 |
| 6,030,847 | A | 2/2000 | Fazan et al. | 438/3 |
| 6,031,263 | A | 2/2000 | Forbes et al. | 257/315 |
| 6,072,209 | A | 6/2000 | Noble et al. | 257/296 |
| 6,097,065 | A | 8/2000 | Forbes et al. | 257/350 |
| 6,104,061 | A | 8/2000 | Forbes et al. | 257/330 |
| 6,124,729 | A | 9/2000 | Noble et al. | 326/41 |
| 6,143,636 | A | 11/2000 | Forbes et al. | 438/587 |
| 6,150,687 | A | 11/2000 | Noble et al. | 257/302 |
| 6,153,468 | A | 11/2000 | Forbes et al. | 438/257 |
| 6,191,448 | B1 | 2/2001 | Forbes et al. | 257/330 |
| 6,238,976 | B1 | 5/2001 | Noble et al. | 438/259 |
| 6,246,083 | B1 | 6/2001 | Noble | 257/296 |
| 6,249,020 | B1 | 6/2001 | Forbes et al. | 257/315 |
| 6,249,460 | B1 | 6/2001 | Forbes et al. | 365/185.28 |
| 6,307,775 | B1 | 10/2001 | Forbes et al. | 365/185.01 |
| 6,350,635 | B1 | 2/2002 | Noble et al. | 438/156 |
| 6,384,448 | B1 | 5/2002 | Forbes | 257/315 |
| 6,399,979 | B1 | 6/2002 | Noble et al. | 257/302 |
| 6,456,535 | B2 | 9/2002 | Forbes et al. | 365/185.28 |
| 6,492,233 | B2 | 12/2002 | Forbes et al. | 438/270 |
| 6,501,116 | B2 | 12/2002 | Kisu et al. | 257/296 |
| 6,504,201 | B1 | 1/2003 | Noble et al. | 257/302 |
| 6,531,730 | B2 | 3/2003 | Sandhu et al. | 257/310 |
| 6,680,864 | B2 | 1/2004 | Noble | 365/177 |
| 2001/0028078 | A1 | 10/2001 | Noble | 257/303 |
| 2001/0030338 | A1 | 10/2001 | Noble | 257/303 |
| 2001/0032997 | A1 | 10/2001 | Forbes et al. | 257/315 |
| 2001/0053096 | A1 | 12/2001 | Forbes et al. | 365/185.28 |
| 2002/0098639 | A1 | 7/2002 | Kisy et al. | 438/238 |
| 2002/0126536 | A1 | 9/2002 | Forbes et al. | 365/185.28 |
| 2003/0001191 | A1 | 1/2003 | Forbes et al. | 257/306 |
| 2003/0155604 | A1 | 8/2003 | Sandhu et al. | 257/310 |
| 2003/0205754 | A1 | 11/2003 | Forbes et al. | 257/314 |

OTHER PUBLICATIONS

Blalock, T. N., et al., "An Experimental 2T Cell RAM with 7 NS Access Time at Low Temperature", *IEEE*, 1990 Symposium on VLSI Circuits, Alabama Microelectronics Science and Technology Center, Electrical Engineering Department, (1990), pp. 13–14.

Kim, Wonchan et al., "A low–voltage multi–bit DRAM cell with a built–in gain stage", *Esscirc 93, Nineteenth European Solid–State Circuits Conference*, (1995), 1 page.

Kim, Wonchan, et al., "An Experimental High–Density DRAM Cell with a Built–In Gain Stage", *IEEE Journal of Solid–State Circuits*, vol. 29, No. 8, (Aug., 1994), pp. 978–981.

Krautschneider, W.H., et al., "Fully scalable gain memory cell for future DRAMs", *Micoelectron Eng. (Netherlands)*, Microelectronic Engineering, vol. 15, No. 1–4, (1991), 1 page.

Krautschneider, F., "Planar Gain Cell for Low Voltage Operation and Gigabit Memories", *Symposium on VLSI Technology Digest of Technical Papers*, (1995), pp. 139–140.

Ohsawa, T., et al., "Memory Design Using One–Transistor Gain Cell on SOI", *ISSCC 2002*, Session Dram and Ferroelectric Memories, (2002), 3 pages.

Okhonin, S., "A SOI Capacitor–less 1T–DRAM Concept", *2001 IEEE International SOI Conference, Proceedings*, (2001), pp. 153–154.

Rabaey, Jan M., Digital Integrated Circuits: A Design Perspective, *Prentice Hall Electronics and VLSI Series*, (1996), pp. 585–590.

Shukuri, S., "A Complementary Gain Cell Technology for Sub–1V Supply DRAMs", *Electron Devices Meeting*, Technical Digest, (1992), pp. 1006–1008.

Shukuri, S., "A Semi–Static Complementary Gain Cell Technology for Sub–1 V Supply DRAM's", *IEEE Transactions on Electron Devices*, vol. 41, No. 6, (Jun. 1994), pp. 926–931.

Shukuri, S., "Super–Low Voltage Operation of a Semi–Static Complementary Gain DRAM Memory Cell", *1993 Symposium on VLSI Technology, Digest of Technical Papers*, (1993), pp. 23–24.

Sunouchi, K, et al., "A Self–Amplifying (SEA) Cell for Future High Density DRAMs", *International Electron Devices Meeting*, Technical Digest, (1991), pp. 465–468.

Takato, H., et al., "Processing integration trends for embedded DRAM," *ULSI Process Integration, Proceedings of the First International Symposium*, Electrochemical Society Proceedings, vol. 99–18 (1999), 2 pages.

Terauchi, M., "A Surrounding Gate Transistor (SGT) Gain Cell for Ultra High Density DRAMs", *1993 Symposium on VLSI Technology*, Digest of Technical Papers, (1993), pp. 21–22.

Wann, Hsing–Jen, et al., "A Capacitorless DRAM Cell on SOI Substrate", *International Electron Devices*, (1993), pp. 635–638.

6F² 3-TRANSISTOR DRAM GAIN CELL

FIELD OF THE INVENTION

The present invention relates generally to integrated circuits, and in particular to a high density vertical three transistor gain cell for DRAM operation.

BACKGROUND OF THE INVENTION

An essential semiconductor device is semiconductor memory, such as a random access memory (RAM) device. A RAM device allows the user to execute both read and write operations on its memory cells. Typical examples of RAM devices include dynamic random access memory (DRAM) and static random access memory (SRAM).

DRAM is a specific category of RAM containing an array of individual memory cells, where each cell includes a capacitor for holding a charge and a transistor for accessing the charge held in the capacitor. The transistor is often referred to as the access transistor or the transfer device of the DRAM cell.

FIG. 1 illustrates a portion of a DRAM memory circuit containing two neighboring DRAM cells 100. Each cell 100 contains a storage capacitor 140 and an access field effect transistor or transfer device 120. For each cell, one side of the storage capacitor 140 is connected to a reference voltage (illustrated as a ground potential for convenience purposes). The other side of the storage capacitor 140 is connected to the drain of the transfer device 120. The gate of the transfer device 120 is connected to a signal known in the art as a word line 180. The source of the transfer device 120 is connected to a signal known in the art as a bit line 160 (also known in the art as a digit line). With the memory cell 100 components connected in this manner, it is apparent that the word line 180 controls access to the storage capacitor 140 by allowing or preventing the signal (representing a logic "0" or a logic "1") carried on the bit line 160 to be written to or read from the storage capacitor 140. Thus, each cell 100 contains one bit of data (i.e., a logic "0" or logic "1").

In FIG. 2 a DRAM circuit 240 is illustrated. The DRAM 240 contains a memory array 242, row and column decoders 244, 248 and a sense amplifier circuit 246. The memory array 242 consists of a plurality of memory cells 200 (constructed as illustrated in FIG. 1) whose word lines 280 and bit lines 260 are commonly arranged into rows and columns, respectively. The bit lines 260 of the memory array 242 are connected to the sense amplifier circuit 246, while its word lines 280 are connected to the row decoder 244. Address and control signals are input on address/control lines 261 into the DRAM 240 and connected to the column decoder 248, sense amplifier circuit 246 and row decoder 244 and are used to gain read and write access, among other things, to the memory array 242.

The column decoder 248 is connected to the sense amplifier circuit 246 via control and column select signals on column select lines 262. The sense amplifier circuit 246 receives input data destined for the memory array 242 and outputs data read from the memory array 242 over input/output (I/O) data lines 263. Data is read from the cells of the memory array 242 by activating a word line 280 (via the row decoder 244), which couples all of the memory cells corresponding to that word line to respective bit lines 260, which define the columns of the array. One or more bit lines 260 are also activated. When a particular word line 280 and bit lines 260 are activated, the sense amplifier circuit 246 connected to a bit line column detects and amplifies the data bit transferred from the storage capacitor of the memory cell to its bit line 260 by measuring the potential difference between the activated bit line 260 and a reference line which may be an inactive bit line. The operation of DRAM sense amplifiers is described, for example, in U.S. Pat. Nos. 5,627,785; 5,280,205; and 5,042,011, all assigned to Micron Technology Inc., and incorporated by reference herein.

The memory cells of dynamic random access memories (DRAMs) are comprised of two main components, a field-effect transistor (FET) and a capacitor which functions as a storage element. The need to increase the storage capability of semiconductor memory devices has led to the development of very large scale integrated (VLSI) cells which provides a substantial increase in component density. As component density has increased, cell capacitance has had to be decreased because of the need to maintain isolation between adjacent devices in the memory array. However, reduction in memory cell capacitance reduces the electrical signal output from the memory cells, making detection of the memory cell output signal more difficult. Thus, as the density of DRAM devices increases, it becomes more and more difficult to obtain reasonable storage capacity.

The majority of DRAM's currently use either stacked capacitor or trench capacitor cells. (See generally, J. Rabaey, Digital Integrated Circuits, Prentice Hall, 585–590 (1996); W. P. Noble et al., "The Evolution of IBM CMOS DRAM Technology," *IBM J. Research and Development*, 39–1/2, 167–188 (1995)). Three transistor, 3-T, planar gain cells, originally used in DRAM's, were abandoned as higher densities were required. This is because three transistor planar gain cells generally require a minimum cell area of twenty-four square photolithographic features ($24F^2$) and can in some case require an area as large as forty-eight square photolithographic features ($48F^2$).

Some "embedded" DRAM memories currently use 3-T gain cells. (See generally, M. Mukai et al., "Proposal of a Logic Compatible Merged-Type Gain Cell for High Density Embedded.," *IEEE Trans. on Electron Devices*, 46–6, 1201–1206 (1999)). These "embedded" 3-T gain cells are more compatible with a standard CMOS logic process than DRAM memory cells which use either stacked capacitors or trench capacitors. That is, stacked capacitors require special processes not available in a CMOS logic process. Trench capacitors are possible in a CMOS logic process, but three additional masking steps are required. (See generally, H. Takato et al., "Process Integration Trends for Embedded DRAM," *Proceedings of ULSI Process Integration, Electrochemicals Society Proceedings*, 99–18, 107–19 (1999)). As a result 3-T DRAM gain cells are the easiest technique to use to incorporate embedded memory into microprocessors. These 3-T gain cells however are planar and they use conventional planar CMOS devices which again requires a cell area which is large. For reference, DRAM cell areas for either stacked capacitor or trench capacitor cells are typically $6F^2$ or $8F^2$.

It is becoming more and more difficult to fabricate stacked capacitor cells with the required DRAM cell capacitance of around 30 fF. Very high aspect ratio capacitors are required with height to diameter ratios of the order ten and consideration is being given to employing high-K dielectrics. Various gain cells have been proposed from time to time. (See generally, L. Forbes, "Single Transistor Vertical Memory (DRAM) Gain Cell," U.S. application Ser. No. 10/231,397; L. Forbes, "Merged MOS-Bipolar-Capacitor Memory (DRAM) Gain Cell," U.S. application Ser. No. 10/230,929; L. Forbes, "Vertical Gain Cell," U.S. application Ser. No. 10/379,478; L. Forbes, "Embedded DRAM Gain Memory Cell," U.S. application Ser. No. 10/309,873; T. Ohsawa et al., "Memory Design Using One Transistor Gain Cell on SOI," IEEE Int. Solid State Circuits Conference, San Francisco, 152–153 (2002); S. Okhonin, M. Nagoga, J. M. Sallese, P. Fazan, "A SOI Capacitor-less 1T-DRAM Cell," Late News 2001 IEEE Intl. SOI Conference, Durango, Colo., 153–154; L. Forbes, "Merged Transistor Gain Cell for Low Voltage DRAM (Dynamic Random Access) Memories," U.S. Pat. No. 5,732,014, 24 Mar. 1998, continuation granted as U.S. Pat. No. 5,897,351, April 27, 1999; Sunouchi et al., "A Self-Amplifying (SEA) Cell for Future High Density DRAMs," Ext. Abstracts of IEEE Int. Electron Device Meeting, 465–468 (1991); M. Terauchi et al., "A Surrounding Gate Transistor (SGT) Gain Cell for Ultra High Density DRAMS," VLSI Tech. Symposium, 21–22 (1993); S. Shukuri et al., "Super-Low-Voltage Operation of a Semi-Static Complementary Gain RAM Memory Cell," VLSI Tech. Symposium, 23–24 (1993); S. Shukuri et al., "Super-Low-Voltage Operation of a Semi-Static Complementary Gain DRAM Memory Cell," Ext. Abs. of IEEE Int. Electron Device Meeting, 1006–1009 (1992); S. Shukuri et al., "A Semi-Static Complementary Gain Cell Technology for Sub-1 V Supply DRAM's," IEEE Trans. on Electron Devices, 41, 926–931(1994); H. Wann and C. Hu, "A Capacitorless DRAM Cell on SOI Substrate," IEEE Int. Electron Devices Meeting, 635–638 (1993); W. Kim et al., "An Experimental High-Density DRAM Cell with a Built-in Gain Stage," IEEE J. of Solid-State Circuits, 29, 978–981 (1994); W. H. Krautschneider et al., "Planar Gain Cell for Low Voltage Operation and Gigabit Memories," Proc. VLSI Technology Symposium, 139–140 (1995); D. M. Kenney, "Charge Amplifying Trench Memory Cell," U.S. Pat. No. 4,970,689, Nov. 13, 1990; M. Itoh, "Semiconductor Memory Element and Method of Fabricating the Same," U.S. Pat. No. 5,220,530, Jun. 15, 1993; W. H. Krautschneider et al., "Process for the Manufacture of a High Density Cell Array of Gain Memory Cells," U.S. Pat. No. 5,308,783, May 3, 1994; C. Hu et al., "Capacitorless DRAM Device on Silicon on Insulator Substrate," U.S. Pat. No. 5,448,513, Sep. 5, 1995; S. K. Banerjee, "Method of Making a Trench DRAM Cell with Dynamic Gain," U.S. Pat. No. 5,066,607, Nov. 19, 1991; S. K. Banerjee, "Trench DRAM Cell with Dynamic Gain," U.S. Pat. No. 4,999,811, Mar. 12, 1991; Lim el al., "Two Transistor DRAM Cell," U.S. Pat. No. 5,122,986, Jun. 16, 1992; Blalock et al., "An Experimental 2T Cell RAM with 7 ns Access at Low Temperature," Proc. VLSI Technology Symposium, 13–14 (1990)).

What is required is a small area gain cell, typically $6F^2$ or $8F^2$, which has the same cell area and density as current DRAM's but one which does not require the high stacked capacitor or deep trench capacitor.

SUMMARY OF THE INVENTION

The above mentioned problems with conventional memories and other problems are addressed by the present invention and will be understood by reading and studying the following specification. A high density vertical three transistor gain cell is realized for DRAM operation.

In one embodiment of the present invention, a high density vertical three transistor memory cell is provided. The high density vertical three transistor memory cell is formed in a vertical pillar. The vertical pillar includes a first vertical transfer device having a source region, a drain region, and a body region therebetween on a first side of the vertical pillar. The vertical pillar also includes a second vertical transfer device having a source region, a drain region, and a body region therebetween on a second side of the vertical pillar. A write data wordline opposes the first vertical transfer device. A read data wordline opposes the second vertical transfer device. A storage capacitor is coupled to the drain region of the first vertical transfer device. The storage capacitor further serves as a gate for a third transistor.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
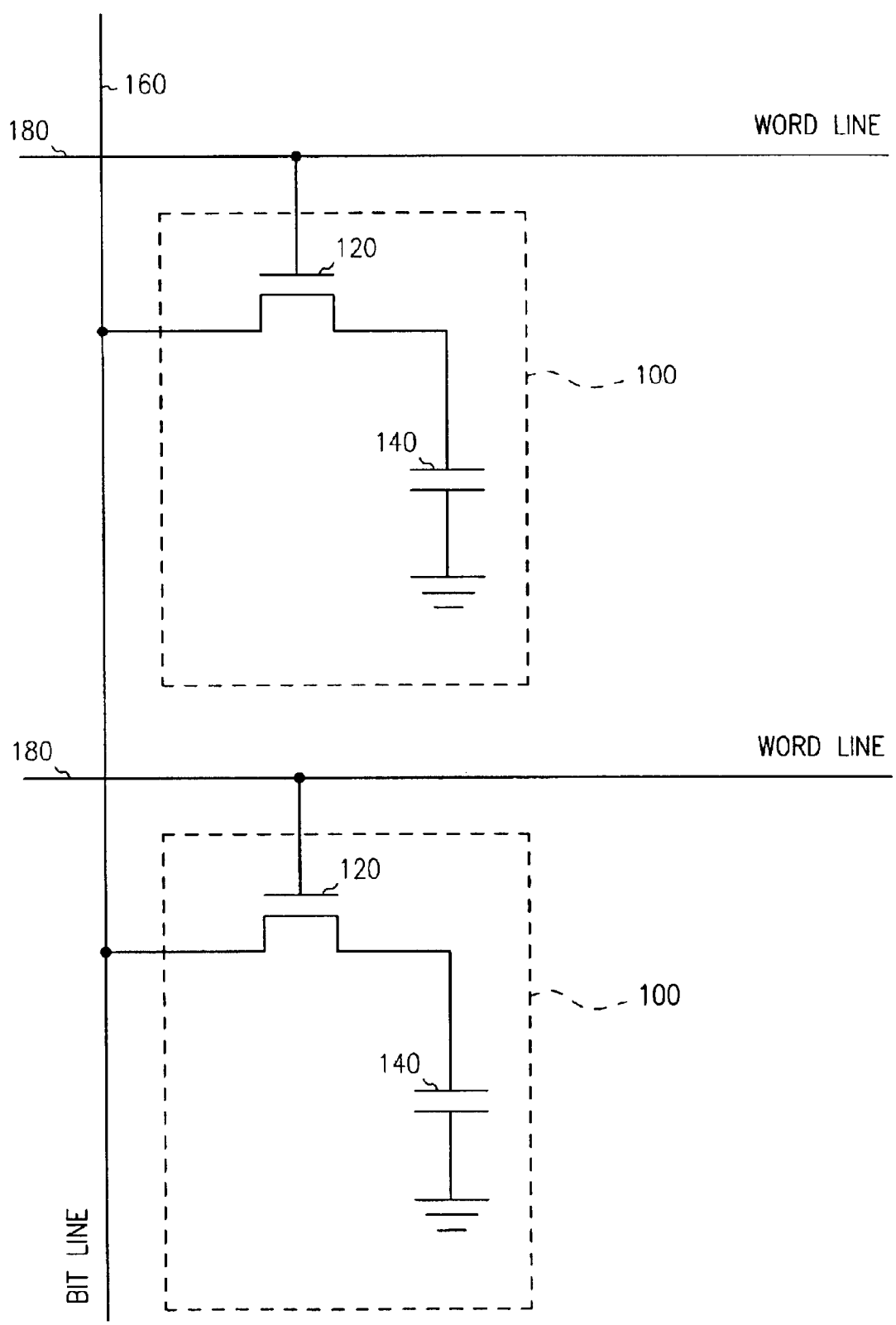
FIG. 1 is a circuit diagram illustrating conventional dynamic random access memory (DRAM) cells.
Figure 2:
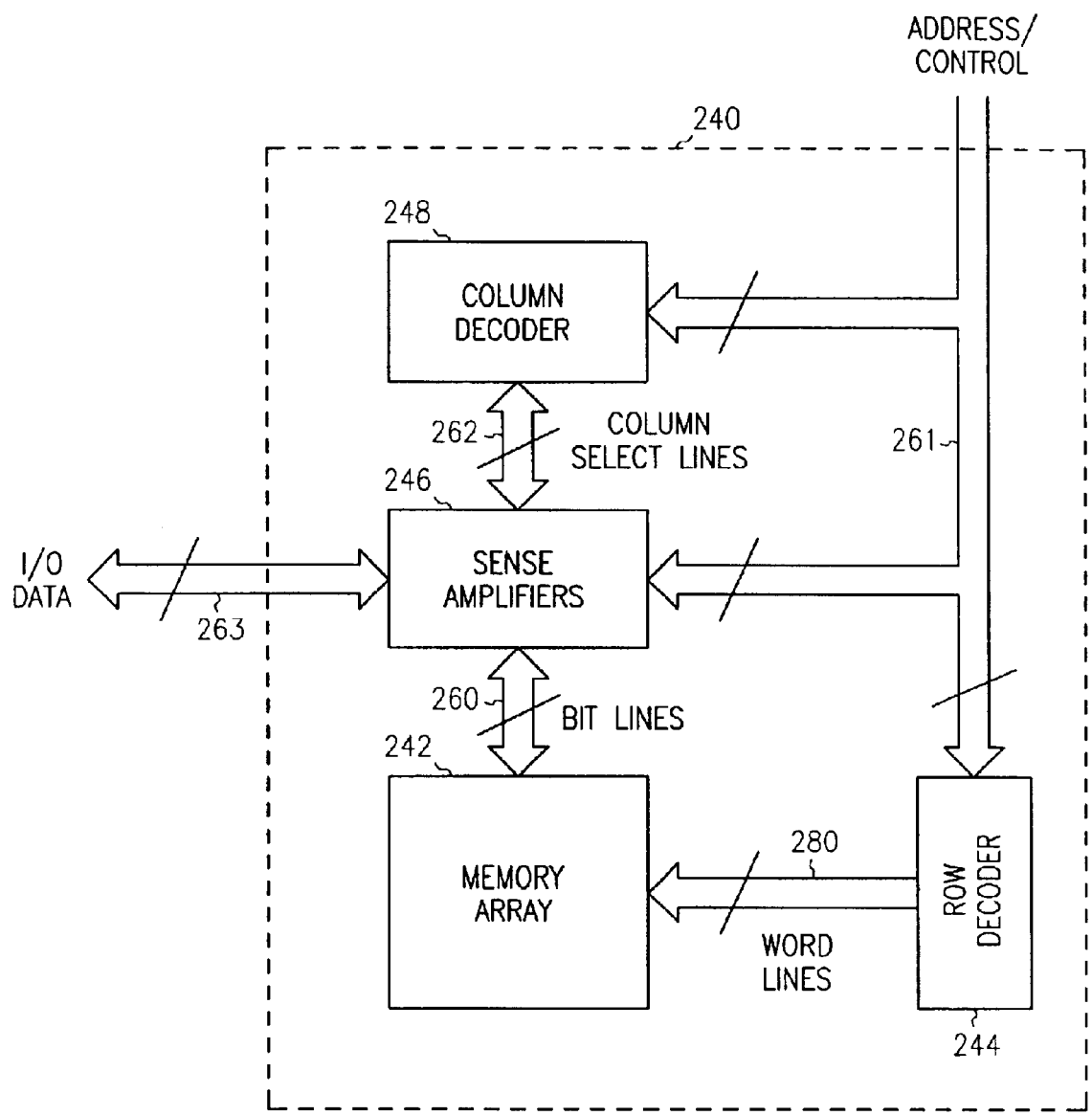
FIG. 2 is a block diagram illustrating a DRAM device.
Figure 3:
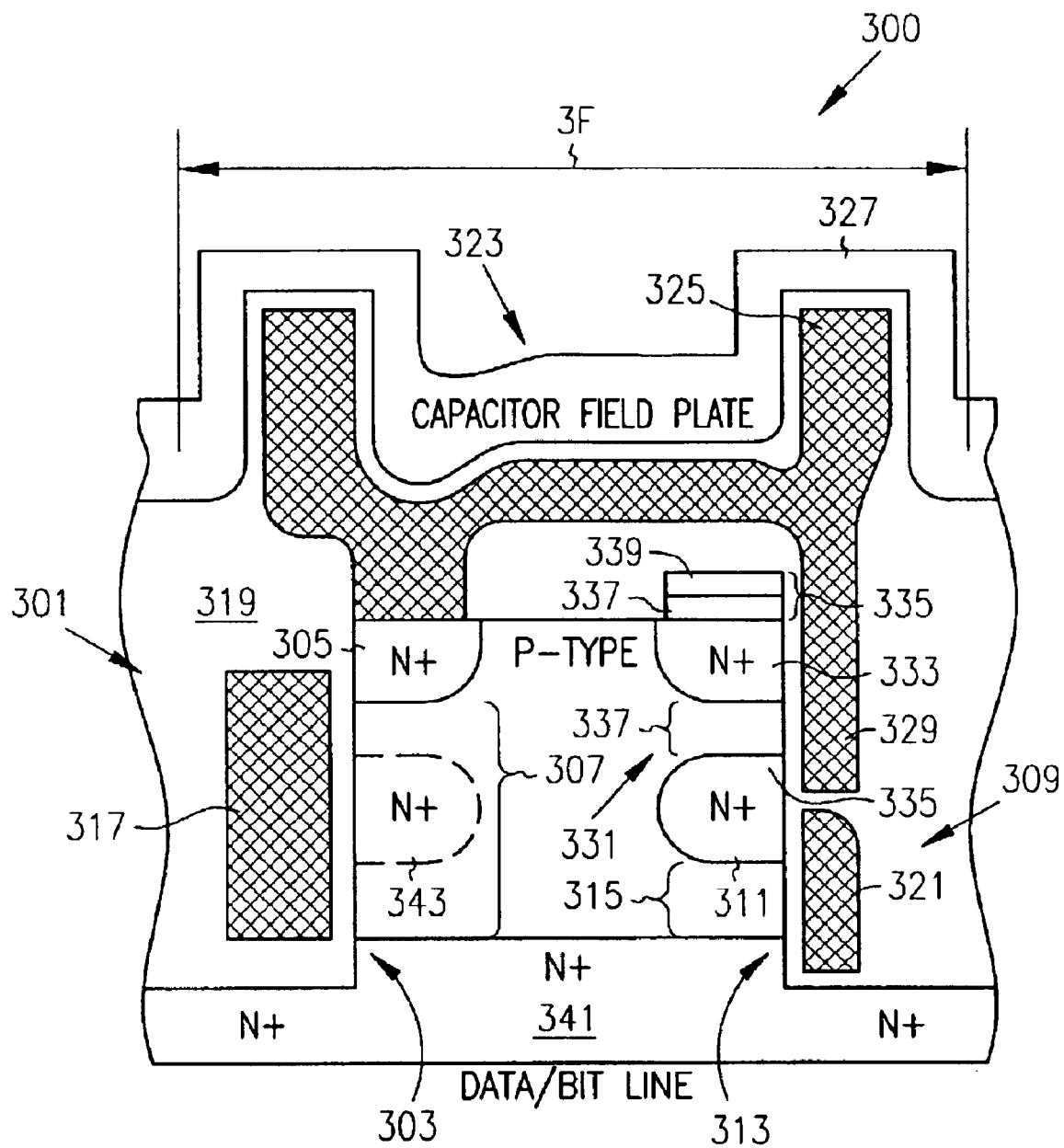
FIG. 3 illustrates a cross sectional embodiment for a high density vertical three transistor, 3-T, gain cell according to the teachings of the present invention.

FIG. 3 illustrates a cross sectional embodiment for a high density vertical three transistor, 3-T, gain cell 300 according to the teachings of the present invention. The three transistor gain cell 300 of the present invention has a cell area of approximately six square photolithographic features (6F$^2$) and is realized for dynamic random access memory (DRAM) operation. That is, the gain cell 300 is suited for use as a dynamic random access memory (DRAM) cell 300.

As shown in the embodiment of FIG. 3, the three transistor gain cell 300 is formed in a vertical pillar. The vertical pillar of the cell 300 includes a first vertical transfer device, or first transfer transistor 301 having a source region 303, a drain region 305, and a body region 307 therebetween on a first side of the vertical pillar. And, the vertical pillar of the cell 300 includes a second vertical transfer device, or second transfer transistor 309 having a source region 311, a drain region 313, and a body region 315 therebetween on a second side of the vertical pillar.

As shown in the embodiment of FIG. 3, a write data wordline 317 opposes the first transfer transistor 301. As one of ordinary skill in the art will appreciate upon reading this disclosure, the write data wordline 317 is separated from the body region 307 of the first transfer transistor by a suitable dielectric material. A read data wordline 321 opposes the second transfer transistor 309, and is likewise separated therefrom by a suitable dielectric.

As shown in the embodiment of FIG. 3, a storage capacitor 323 is coupled to the drain region 305 of the first transfer transistor 301. The storage capacitor 323 includes a first plate 325 and a second plate 327. The first plate 325 is coupled to the drain region 305 of the first transfer transistor 301. According to the teachings of the present invention, the storage capacitor 323 further serves as a gate for a third transistor 331 of the cell 300. In particular, a portion 329 of the first plate 325 of the storage capacitor 323 serves as a gate 329 for a third transistor 331 of the cell 300. The third transistor 331 includes a source region 333, a drain region 335, and a body region 337 therebetween on the second side of the vertical pillar. According to the teachings of the present invention, the third transistor 331 serves as a gain transistor 331. The source region 333 of the third transistor 331 is coupled to a ground potential 335. In the embodiment of FIG. 3, the connection to a ground potential includes a polysilicon layer 337 coupled to the source region 333 and a Tungsten layer 339 coupled to the polysilicon layer 337. In the embodiment of FIG. 3 it is noted that the drain region 335 for the third transistor 331 integrally serves as the source region 311 for the second transfer transistor 309 on the second side of the pillar.

As shown in FIG. 3, the cell 300 further includes a shared data bit line 341. In the embodiment shown in FIG. 3, the shared data bit line 341 integrally forms the source region 303 for the first transfer transistor 301 and integrally serves as the drain 313 for the second transfer transistor 309.

As shown in the embodiment of FIG. 3, the body region 307 of the first transfer transistor 301 includes a doped region 343 formed therein. According to the teachings of the invention, the doped region 343 is of like conductivity as the source and the drain region, 303 and 305, of the first transfer transistor 301. The inclusion of the doped region 343 facilitates an ease of fabrication since the pillar of the cell 300 can be formed in a symmetrical fashion. The first transfer transistor 301 of the vertical three transistor gain cell 300 is driven by the write data wordline 317 to establish a conductive channel between the source 303 and the drain region 305. As one of ordinary skill in the art will appreciate upon reading this disclosure, the presence of the doped region 343 does not hinder the formation of a conductive channel between the source and drain regions, 303 and 305, since the doped region 343 is of like conductivity as the source and the drain region, 303 and 305.

In the embodiment shown in FIG. 3, the three transistor gain cell 300 includes a vertical pillar formed of a p-type conductivity semiconductor material. As illustrated in FIG. 3, the p-type conductivity semiconductor material of the vertical pillar serves as the body region material for the first vertical transfer device 301, the second vertical transfer device 309, and the third transistor 331. In this embodiment, the source and the drain regions of the first vertical transfer device 301, the second vertical transfer device 309, and the third transistor 331 are formed of an n-type conductivity material. The invention, however, is not so limited. And, one of ordinary skill in the art will understand upon reading this disclosure that the respective conductivity types can be reversed, or interchanged.

Figure 4:
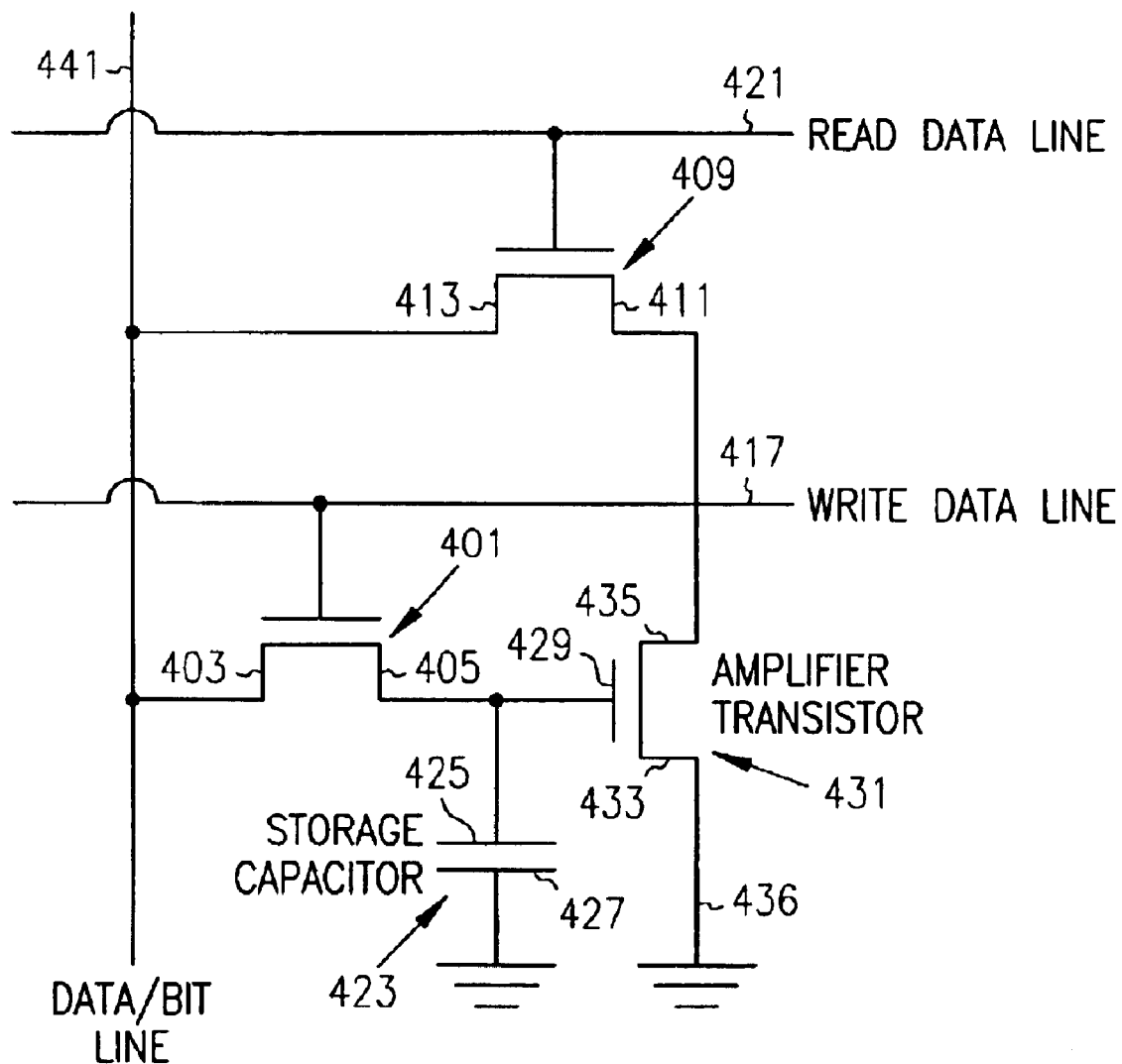
FIG. 4 is a schematic illustration for an embodiment of a high density vertical three transistor gain cell according to the teachings of the present invention.

FIG. 4 is a schematic illustration for an embodiment of a high density vertical three transistor gain cell according to the teachings of the present invention. That is, FIG. 4 illustrates a first transistor 401 having a source region 403 and a drain region 405. The drain region 405 is coupled to a first plate 425 of a storage capacitor 423. In the embodiment of FIG. 4, a second plate 427 of the storage capacitor is coupled to a ground potential.

As shown in FIG. 4, a gate of the first transistor 401 is coupled to a write data wordline 417. A second transistor 409 includes a source region 411 and a drain region 413. Both the source region 403 for the first transistor 401 and the drain region 313 for the second transistor 409 are coupled to a shared data bit line 441. A gate for the second transistor 409 is coupled to a read data wordline.

The schematic embodiment of FIG. 4 further illustrates that the first plate 425 of the storage capacitor 423 integrally serves as a gate 429 to a third transistor 431. The third transistor includes a source region 433 coupled to a ground potential 436 and a drain region 435 coupled to the source region 411 of the second transistor.

Methods of Fabrication

The inventors have previously disclosed a variety of vertical devices and applications employing transistors along the sides of rows or fins etched into bulk silicon or silicon on insulator wafers for devices in array type applications in memories. (See generally, U.S. Pat. Nos. 6,072, 209; 6,150,687; 5,936,274 and 6,143,636; 5,973,356 and 6,238,976; 5,991,225 and 6,153;468; 6,124,729; 6,097,065). The present invention uses similar techniques to fabricate the high density vertical three transistor gain cell described herein. Each of the above reference US Patents is incorporated in full herein by reference.

Figure 5A:
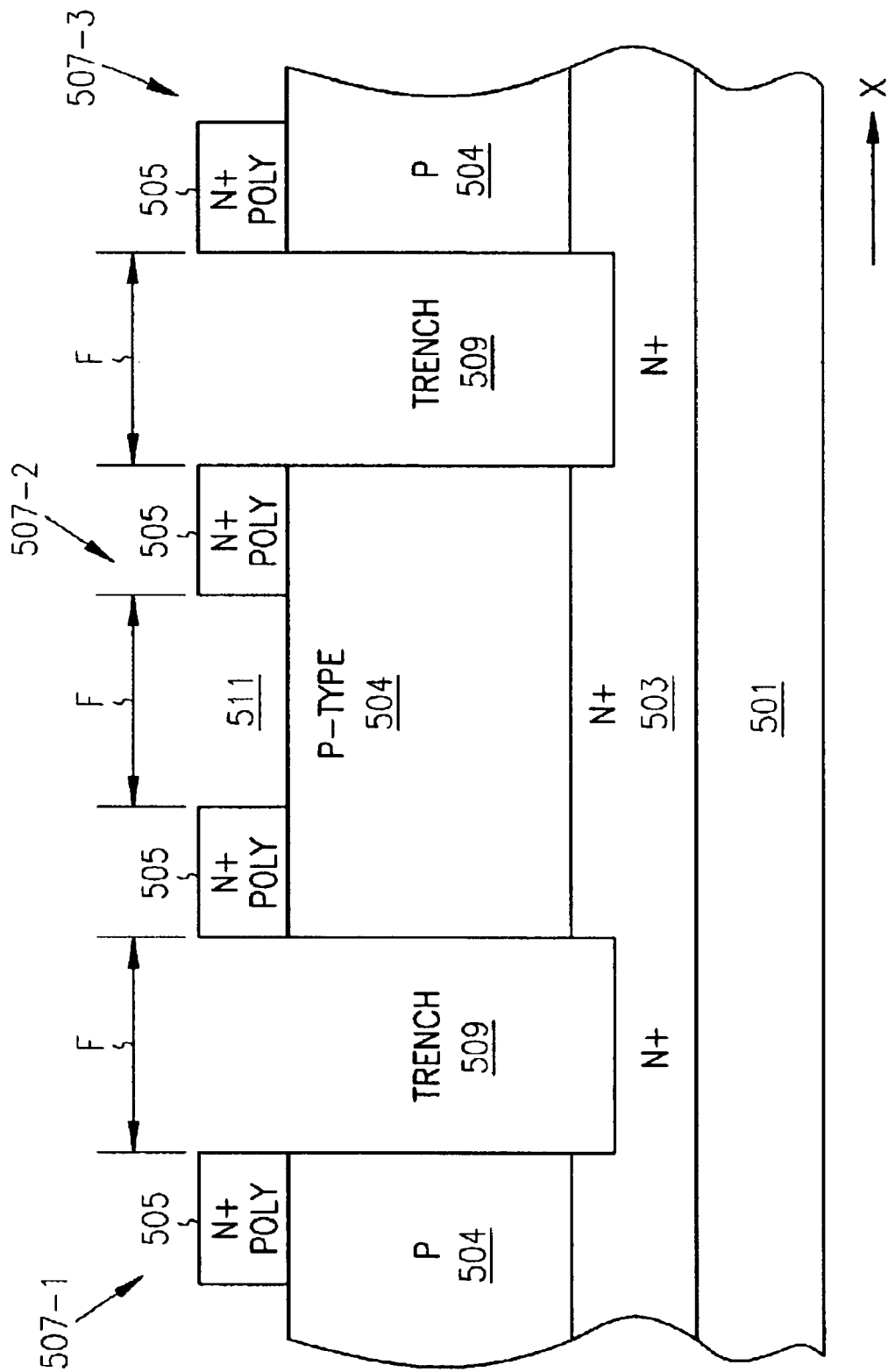
FIGS. 5A–5D illustrate a fabrication embodiment for the high density vertical three transistor gain cell according to the teachings of the present invention
Figure 5B:
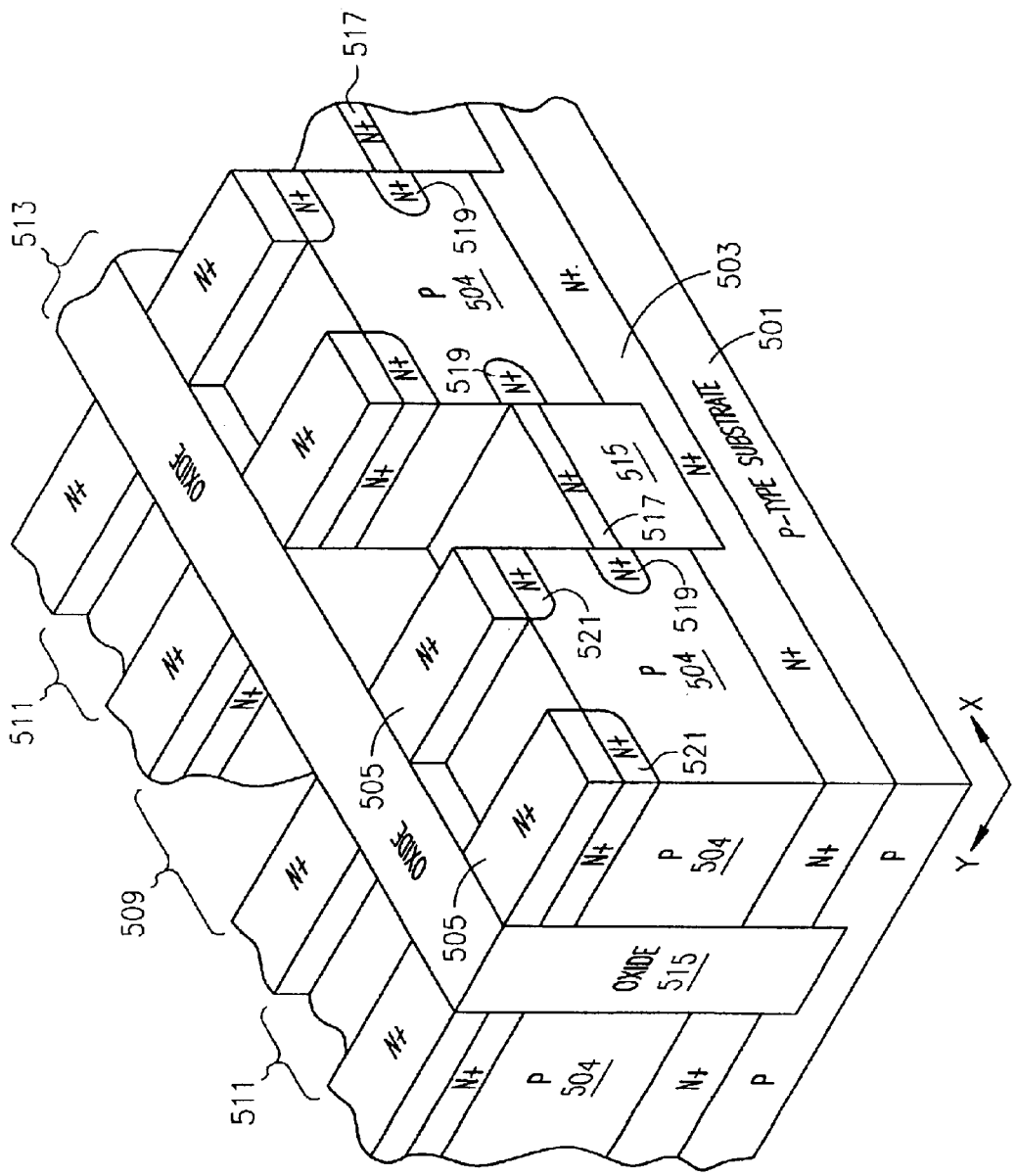

FIG. 5A outlines one embodiment of a fabrication technique for the embodiment illustrated in FIG. 3. In FIG. 5A, a p-type substrate 501 has been processed to include layers thereon of an n+ conductivity type 503 and a p conductivity type 504, and to include a polysilicon layer of n+ conductivity type 505. In the embodiment of FIG. 5A, the wafer, or substrate, 501 is first covered with the doped epitaxial layers, 503 and 504, and with the doped polysilicon layer 505. The polysilicon and epitaxial layers are patterned leaving gaps of one critical dimension of minimum feature size, F. Oxide and silicon nitride layers are deposited (not shown) to function as an etch mask for the anisotropic or directional silicon etch which will follow. This nitride mask and underlying oxide are patterned and trenches 509, and 513 shown in FIG. 5B, are etched as shown in both directions, e.g. direction x which is parallel to the plane and direction y running in to the plane of the page in FIG. 5A, leaving blocks of silicon, e.g. 507-1, 507-2, and 507-3, having layers of n and p type conductivity material. Trenches 509 are viewable in the cross sectional representation in the x-direction in FIG. 5A. Both trenches 509 in the x-direction and trenches 513 in the y-direction are viewable in the perspective view of FIG. 5B. Any number of such blocks can be formed on the wafer.

As shown in the embodiment of FIG. 5A, the masking in one direction for the silicon nitride etch is offset by one half a minimum feature size (½ F) from the notches in the underlying doped polysilicon layer 505. This leaves two doped polysilicon blocks along the edges of the silicon pillars, e.g. see 505 at the top of pillar 507-2, with less than minimum feature sizes. Two masking steps are used and one set of trenches, e.g. trench 513 formed parallel to the x-direction and shown in FIG. 5B, is made deeper than the other, e.g. trenches 509, in order to provide separation and isolation of the write data bit lines formed from n+ doped layer 503. The structure is now as appears in FIG. 5A.

FIG. 5B illustrates the fabrication embodiment after the next sequence of processing steps. In FIG. 5B, both trenches, 509 and 513, are filled with oxide 515 and the whole structure planarized by CMP. The oxide in one trench 509 is recessed below the top of the silicon pillar and the trench 509 is filled with heavily doped polysilicon 517. The resulting structure is planarized by CMP. The heavily doped polysilicon 517 in this trench 509 is recessed to a level below the top of the planar structure. The resulting structure is heat treated to dope the central portion of the silicon pillars 519 and dope the top regions of the pillars as shown at 521. The resulting structure appears in FIG. 5B.

Figure 5C:
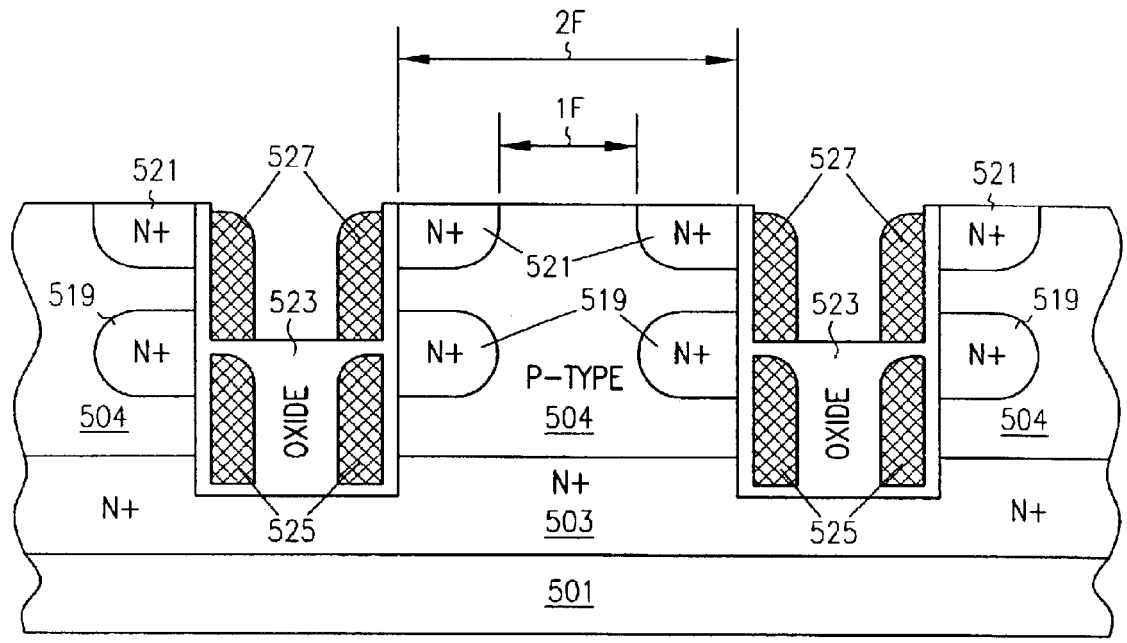

FIG. 5C illustrates the fabrication embodiment after the next sequence of processing steps. In FIG. 5C, the heavily doped polysilicon 517 is removed from trench 509. The underlying oxide 515 is removed and a gate oxidation 523 performed. Polysilicon is again deposited in the trench 509, planarized, and then recessed below the top of the pillar up to the edge of the previously formed diffused and doped regions 519. This polysilicon is directionally etched to leave polysilicon only on the sidewalls forming the gate and read data word lines 525 in this trench 509. Oxide is deposited, planarized and recessed below the top of the pillar. Polysilicon is again deposited in the trench 509 and planarized. This polysilicon is directionally etched to leave second gates 527 only on the sidewalls and separated from the previously formed read data word lines 525. The resulting structure appears in FIG. 5C.

Figure 5D:
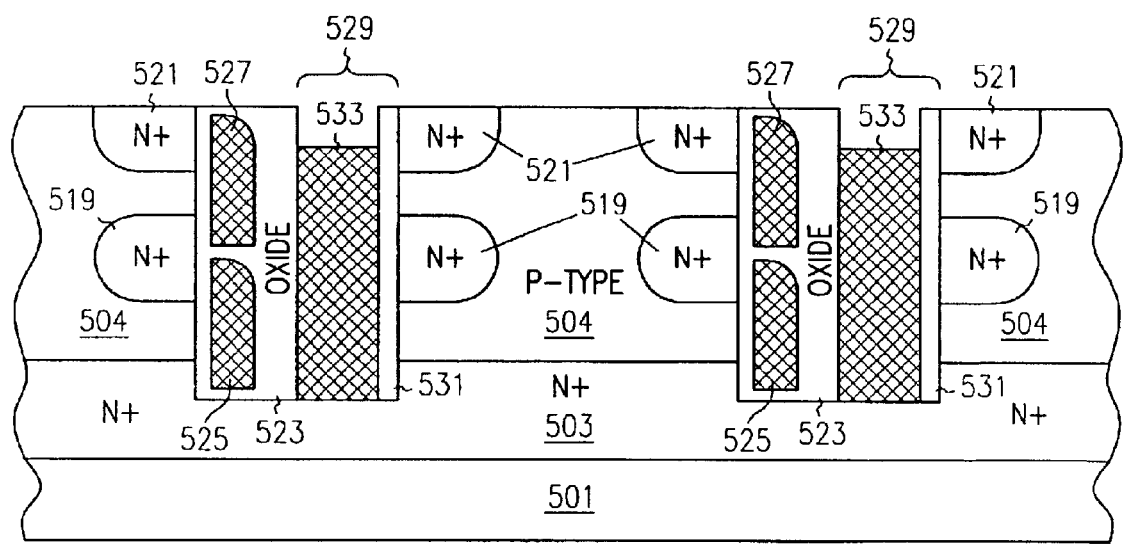

FIG. 5D illustrates the fabrication embodiment after the next sequence of processing steps. In FIG. 5D, The trenches 509 are filled with oxide and the structure planarized by CMP. The structure is masked and oxide and polysilicon, e.g. gates 527 and 525 where appropriate in region 529, is then removed from one side the trenches 509 for the formation of write data word lines. A gate oxidation 531 is performed and this side of the trenches 529 is filled with polysilicon 533 and planarized to form the gates and write data word lines 533. The resulting structure appears in FIG. 5D.

The remaining structure to fabricate the high density vertical three transistor gain cell as shown in FIG. 3 can be realized by conventional techniques. The stacked capacitors on top can be realized using conventional technology and metallurgy employed in current DRAMs.

The cell can provide a very high gain and amplification of the stored charge on the gate of the NMOS gain transistor, e.g. transistor 331 in FIG. 3. A small change in the charge stored on the gate will result in a large difference in the number of electrons conducted between the drain and source of this NMOS transistor during the read data operation. This amplification allows the small storage capacitance connected to the gain transistor gate to be used instead of a large stacked capacitor storage capacitance. The resulting cell has a very high density with a cell area of $6F^2$, where F is the minimum feature size, and whose vertical extent is far less than the total height of a stacked capacitor or trench capacitor cell and access transistor.

While the description here has been given for a p-type substrate an alternative embodiment would work equally well with n-type or silicon-on-insulator substrates. In that case the transistors would be PMOS transistors with an n-type body.

System Level

Figure 6:
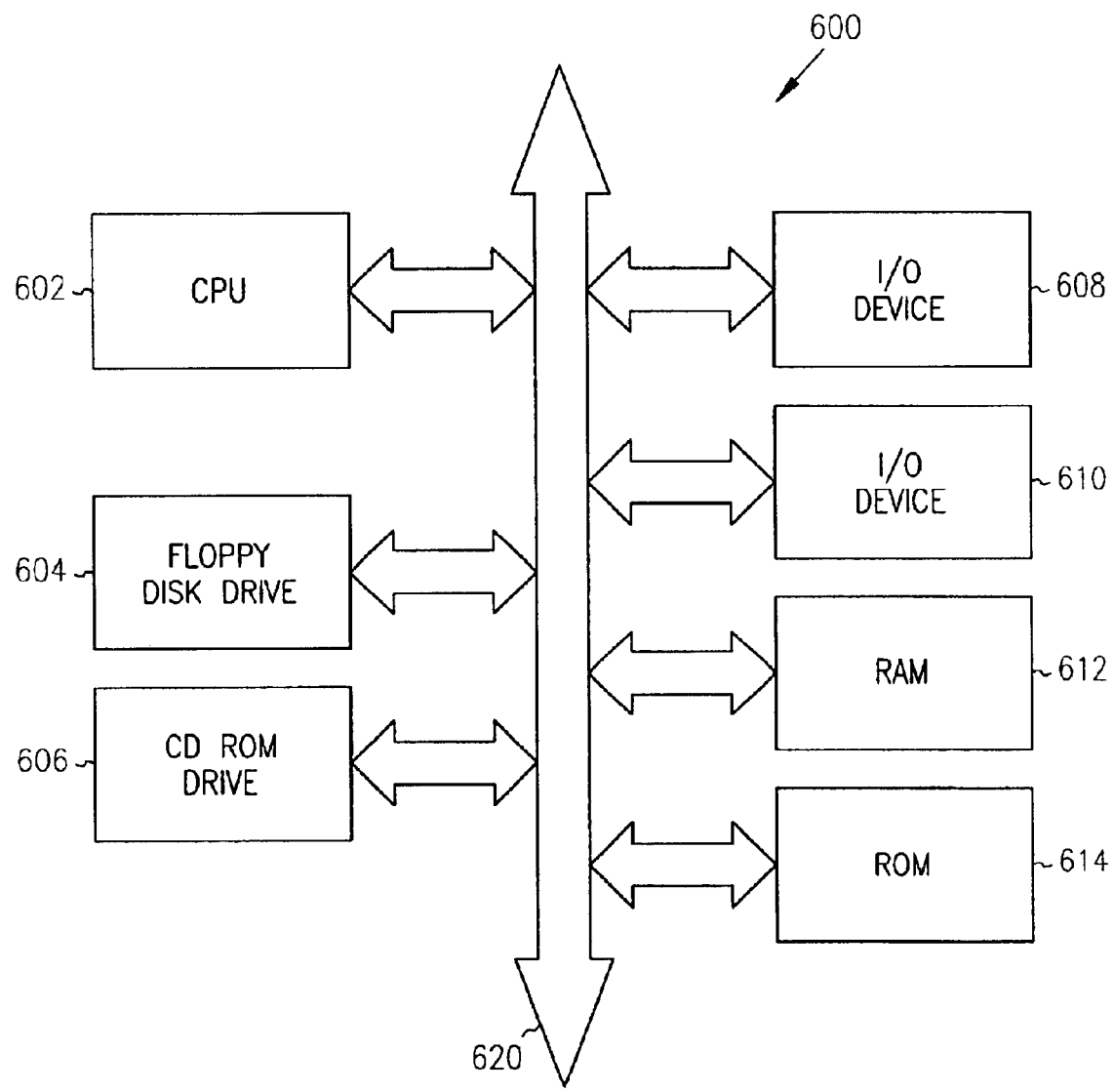
FIG. 6 is a block diagram illustrating an embodiment of an electronic system utilizing the high density vertical three transistor gain cells of the present invention.

FIG. 6 is a block diagram of a processor-based system 600 utilizing high density vertical three transistor gain cells constructed in accordance with the present invention. That is, the system 600 utilizes the memory cell illustrated in FIGS. 3–5D. The processor-based system 600 may be a computer system, a process control system or any other system employing a processor and associated memory. The system 600 includes a central processing unit (CPU) 602, e.g., a microprocessor, that communicates with the RAM 612 and an I/O device 608 over a bus 620. It must be noted that the bus 620 may be a series of buses and bridges commonly used in a processor-based system, but for convenience purposes only, the bus 620 has been illustrated as a single bus. A second I/O device 610 is illustrated, but is not necessary to practice the invention. The processor-based system 600 also includes read-only memory (ROM) 614 and may include peripheral devices such as a floppy disk drive 604 and a compact disk (CD) ROM drive 606 that also communicates with the CPU 602 over the bus 620 as is well known in the art.

It will be appreciated by those skilled in the art that additional circuitry and control signals can be provided, and that the processor-based system 600 has been simplified to help focus on the invention.

It will be understood that the embodiment shown in FIG. 6 illustrates an embodiment for electronic system circuitry in which the novel high density vertical three transistor gain cells of the present invention are used. The illustration of system 601, as shown in FIG. 6, is intended to provide a general understanding of one application for the structure and circuitry of the present invention, and is not intended to serve as a complete description of all the elements and features of an electronic system using the novel memory cell structures. Further, the invention is equally applicable to any size and type of system 600 using the novel memory cells of the present invention and is not intended to be limited to that described above. As one of ordinary skill in the art will understand, such an electronic system can be fabricated in single-package processing units, or even on a single semi-conductor chip, in order to reduce the communication time between the processor and the memory device.

Applications containing the novel high density vertical three transistor gain cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

A high density vertical 3-transistor, 3-T, gain cell is realized for DRAM operation. Two vertical transfer devices and, one on either side of the cell, serve to connect the cell to a shared data/bit line. Two separate word lines are connected to two transfer device gates to either write data or read data. Because the cell has gain, only a smaller storage capacitor is required at the top of the cell rather than a very high stacked capacitor. Gain or charge amplification is provided by a transistor having a gate connected to the storage capacitor.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A memory cell, comprising:
    a vertical pillar having;
        a first vertical transfer device having a source region, a drain region, and a body region therebetween on a first side of the vertical pillar; and
        a second vertical transfer device having a source region, a drain region, and a body region therebetween on a second side of the vertical pillar;
    a write data wordline opposing the first vertical transfer device;
    a read data wordline opposing the second vertical transfer device; and
    a storage capacitor coupled to the drain region of the first vertical transfer device, wherein the storage capacitor further serves as a gate for a third transistor.

2. The memory cell of claim 1, wherein the memory cell further includes a shared data bit line, wherein the shared data bit line integrally forms the source region for the first vertical transfer device and integrally serves as the drain for the second vertical transfer device.

3. The memory cell of claim 1, wherein the third transistor includes a source region, a drain region, and a body region therebetween on the second side of the vertical pillar, and wherein the third transistor serves as a gain transistor.

4. The memory cell of claim 3, wherein the source region of the third transistor is coupled to a ground potential, and wherein the drain region for the third transistor serves as the source region for the second vertical transfer device on the second side of the pillar.

5. The memory cell of claim 1, wherein the first vertical transfer device includes a doped region formed in the body region, wherein the doped region is of like conductivity to the source and the drain region of the first vertical transfer device.

6. The memory cell of claim 5, wherein the vertical pillar is formed of a p-type conductivity semiconductor material which serves as the body region for the first vertical transfer device, the second vertical transfer device, and the third transistor, and wherein the source and the drain regions of the first vertical transfer device, the second vertical transfer device, and the third transistor are formed of an n-type conductivity material.

7. The memory cell of claim 1, wherein the memory cell has an cell area of approximately six square photolithographic features ($6F^2$).

8. A three transistor gain cell formed in a vertical pillar, comprising:
    a first transfer transistor having a source region, a drain region, and a body region therebetween on a first side of the vertical pillar;
    a second transfer transistor having a source region, a drain region, and a body region therebetween on a second side of the vertical pillar;
    a write data wordline opposing the first transfer transistor;
    a read data wordline opposing the second transfer transistor; and
    a storage capacitor coupled to the drain region of the first transfer transistor, wherein the storage capacitor further serves as a gate for a third transistor.

9. The three transistor gain cell of claim 8, wherein the cell further includes a shared data bit line, wherein the shared data bit line integrally forms the source region for the first transfer transistor and integrally serves as the drain region for the second transfer transistor.

10. The three transistor gain cell of claim 8, wherein the third transistor includes a source region, a drain region, and a body region therebetween on the second side of the vertical pillar, and wherein the third transistor serves as a gain transistor.

11. The three transistor gain cell of claim 10, wherein the source region of the third transistor is coupled to a ground potential, and wherein the drain region for the third transistor serves as the source region for the second transfer transistor on the second side of the pillar.

12. The three transistor gain cell of claim 8, wherein the first transfer transistor includes a doped region formed in the body region, wherein the doped region is of like conductivity as the source and the drain region of the first transfer transistor.

13. The three transistor gain cell of claim 8, wherein the vertical pillar is formed of a p-type conductivity semiconductor material which serves as the body region for the first vertical transfer device, the second vertical transfer device, and the third transistor, and wherein the source and the drain regions of the first vertical transfer device, the second vertical transfer device, and the third transistor are formed of an n-type conductivity material.

14. The three transistor gain cell of claim 8, wherein the storage capacitor includes a first plate and a second plate, wherein the first plate is coupled to the drain region of the first transfer transistor and serves as the gate for the third transistor.

15. The three transistor gain cell of claim 8, wherein the cell has an cell area of approximately six square photolithographic features ($6F^2$).

16. The three transistor gain cell of claim 8, wherein the gain cell is a dynamic random access memory (DRAM) cell.

17. A memory array, comprising:
    a number of vertical pillars, wherein each vertical pillar forms a three transistor gain cell, wherein the three transistor gain cell includes;
        a first transfer transistor having a source region, a drain region, and a body region therebetween on a first side of the vertical pillar;
        a second transfer transistor having a source region, a drain region, and a body region therebetween on a second side of the vertical pillar; and
        a storage capacitor coupled to the drain region of the first transfer transistor, wherein the storage capacitor further serves as a gate for a third transistor formed on the second side of the vertical pillar;

a number of write data wordlines opposing the first transfer transistor in each pillar formed in trenches along rows of pillars; and a number of read data wordlines opposing the second transfer transistor in each pillar in trenches along rows of pillars.

18. The memory array of claim 17, wherein the array further includes a number of buried, shared data bit lines beneath the pillars and isolated from neighboring columns of pillars such that the buried, shared data bit lines couple pillars along columns, wherein the shared data bit lines integrally form the source region for the first transfer transistor and integrally form the drain region for the second transfer transistor in each pillar.

19. The memory array of claim 17, wherein, in each pillar, the third transistor includes a source region, a drain region, and a body region therebetween on the second side of the vertical pillar, and wherein the third transistor serves as a gain transistor.

20. The memory array of claim 19, wherein, in each pillar, the source region of the third transistor is coupled to a ground potential, and wherein the drain region for the third transistor serves as the source region for the second transfer transistor on the second side of the pillar.

21. The memory array of claim 17, wherein, in each pillar, the first transfer transistor includes a doped region formed in the body region, wherein the doped region is of like conductivity as the source and the drain region of the first transfer transistor.

22. The memory array of claim 17, wherein each vertical pillar is formed of a p-type conductivity semiconductor material which serves as the body region for the first vertical transfer device, the second vertical transfer device, and the third transistor, and wherein the source and the drain regions of the first vertical transfer device, the second vertical transfer device, and the third transistor are formed of an n-type conductivity material.

23. The memory array of claim 17, wherein the storage capacitor, in each pillar, includes a first plate and a second plate, wherein the first plate is coupled to the drain region of the first transfer transistor, wherein the first plate also serves as the gate for the third transistor.

24. The memory array of claim 17, wherein each three transistor gain cell has a cell area of approximately six square photolithographic features ($6F^2$).

25. The memory array of claim 17, wherein the array is a dynamic random access memory (DRAM) array.

26. The memory array of claim 17, wherein the memory array is included in a dynamic random access memory (DRAM) chip.

27. An electronic system, comprising:
a processor; and
a memory operably coupled to the processor, wherein the memory includes a memory array having;
a number of vertical pillars, wherein each vertical pillar forms a three transistor gain cell, wherein the three transistor gain cell includes;
a first transfer transistor having a source region, a drain region, and a body region therebetween on a first side of the vertical pillar;
a second transfer transistor having a source region, a drain region, and a body region therebetween on a second side of the vertical pillar; and
a storage capacitor coupled to the drain region of the first transfer transistor, wherein the storage capacitor further serves as a gate for a third transistor formed on the second side of the vertical pillar;

a number of write data wordlines opposing the first transfer transistor in each pillar formed in trenches along rows of pillars; and a number of read data wordlines opposing the second transfer transistor in each pillar in trenches along rows of pillars.

28. The electronic system of claim 27, wherein the array further includes a number of buried, shared data bit lines beneath the pillars and isolated from neighboring columns of pillars such that the buried, shared data bit lines couple pillars along columns, wherein the shared data bit lines integrally form the source region for the first transfer transistor and integrally form the drain region for the second transfer transistor in each pillar.

29. The electronic system of claim 27, wherein, in each pillar, the third transistor includes a source region, a drain region, and a body region therebetween on the second side of the vertical pillar, and wherein the third transistor serves as a gain transistor.

30. The electronic system of claim 27, wherein, in each pillar, the source region of the third transistor is coupled to a ground potential, and wherein the drain region for the third transistor serves as the source region for the second transfer transistor on the second side of the pillar.

31. The electronic system of claim 27, wherein, in each pillar, the first transfer transistor includes a doped region formed in the body region, wherein the doped region is of like conductivity as the source and the drain region of the first transfer transistor.

32. The electronic system of claim 27, wherein each vertical pillar is formed of a p-type conductivity semiconductor material which serves as the body region for the first vertical transfer device, the second vertical transfer device, and the third transistor, and wherein the source and the drain regions of the first vertical transfer device, the second vertical transfer device, and the third transistor are formed of an n-type conductivity material.

33. The electronic system of claim 27, wherein the storage capacitor, in each pillar, includes a first plate and a second plate, wherein the first plate is coupled to the drain region of the first transfer transistor, wherein the first plate also serves as the gate for the third transistor.

34. The electronic system of claim 27, wherein each three transistor gain cell has a cell area of approximately six square photolithographic features ($6F^2$).

35. The electronic system of claim 27, wherein the array is a dynamic random access memory (DRAM) array.

36. A method of forming a three transistor gain cell in a vertical pillar, comprising:
forming a first transfer transistor having a source region, a drain region, and a body region therebetween on a first side of the vertical pillar;
forming a second transfer transistor having a source region, a drain region, and a body region therebetween on a second side of the vertical pillar;
forming a write data wordline opposing the first transfer transistor;
forming a read data wordline opposing the second transfer transistor; and
forming a storage capacitor coupled to the drain region of the first transfer transistor, wherein the storage capacitor further serves as a gate for a third transistor.

37. The method of claim 36, wherein forming the cell further includes forming a shared data bit line, wherein forming the shared data bit line includes integrally forming the shared data bit line to serve as the source region for the first transfer transistor, and forming the shared data bit line to serve as the drain region for the second transfer transistor.

38. The method of claim 36, wherein forming the storage capacitor to serve as a gate for a third transistor the third transistor includes forming a source region, a drain region, and a body region therebetween on the second side of the vertical pillar, and wherein the third transistor serves as a gain transistor.

39. The method of claim 38, wherein forming the source region of the third transistor includes coupling the source region to a ground potential, and wherein forming the drain region for the third transistor includes forming the drain region to serve as the source region for the second transfer transistor on the second side of the pillar.

40. The method of claim 36, wherein forming the first transfer transistor includes forming a doped region in the body region thereof, wherein the doped region is of like conductivity as the source and the drain region of the first transfer transistor.

41. The method of claim 36, wherein method includes forming the vertical pillar of a p-type conductivity semiconductor material which serves as the body region for the first vertical transfer device, the second vertical transfer device, and the third transistor, and the method includes forming the source and the drain regions of the first vertical transfer device, the second vertical transfer device, and the third transistor are formed of an n-type conductivity material.

42. The method of claim 36, wherein the forming the storage capacitor includes forming a first plate and a second plate, wherein forming the first plate includes coupling the first plate to the drain region of the first transfer transistor, and forming the first plate to serve as the gate for the third transistor.

43. The method of claim 36, wherein forming the cell includes forming a three transistor gain cell which has an cell area of approximately six square photolithographic features ($6F^2$).

44. The method of claim 36, wherein forming the cell includes forming a three transistor dynamic random access memory (DRAM) gain cell.

45. A method for operating a memory cell, comprising:
providing a high density vertical three transistor gain cell formed in a vertical pillar, the gain cell including;
a first transfer transistor having a source region, a drain region, and a body region therebetween on a first side of the vertical pillar;
a second transfer transistor having a source region, a drain region, and a body region therebetween on a second side of the vertical pillar;
a write data wordline opposing the first transfer transistor;
a read data wordline opposing the second transfer transistor; and
a storage capacitor coupled to the drain region of the first transfer transistor, wherein the storage capacitor further serves as a gate for a third transistor formed on the second side of the vertical pillar; and
providing charge amplification using the gate of the third transistor.

46. The method of claim 45, wherein the method includes storing a first state on the storage capacitor, wherein storing a first state on the storage capacitor includes providing a stored charge to the gate of the third transistor.

47. The method of claim 46, wherein providing a stored charge to the gate of the third transistor increases the charge amplification of the third transistor.

48. The method of claim 45, wherein the method includes storing a second state on the storage capacitor, wherein storing a second state on the storage capacitor includes removing a stored charge from the gate of the third transistor.

49. The method of claim 45, wherein the method includes storing a charge on the gate of the third transistor, wherein storing a charge on the gate of the third transistor includes;
biasing the write data wordline opposing the first transfer transistor to a positive potential; and
applying a positive potential to a shared data bit line which is integrally formed with the source region of the first transfer transistor.

50. The method of claim 49, wherein the method further includes reading a state of the memory cell, wherein reading the state of the memory cell includes;
biasing read data wordline opposing the second transfer transistor; and
enabling the shared data bit line, wherein the shared data bit line is integrally formed with the drain region of the second transfer transistor.

51. The method of claim 45, wherein providing a high density vertical three transistor gain cell formed in a vertical pillar includes providing a vertical pillar which is formed of a p-type conductivity semiconductor material which serves as the body region for the first vertical transfer device, the second vertical transfer device, and the third transistor, and wherein the source and the drain regions of the first vertical transfer device, the second vertical transfer device, and the third transistor are formed of an n-type conductivity material.

52. A high density vertical three transistor gain cell formed in a vertical pillar, comprising:
a first transistor having a source region, a drain region, and a body region therebetween on a first side of the vertical pillar;
a second transistor having a source region, a drain region, and a body region therebetween on a second side of the vertical pillar;
a third transistor having a source region, a drain region, and a body region therebetween on the second side of the vertical pillar;
a write data wordline opposing the first transfer transistor;
a read data wordline opposing the second transfer transistor; and
means for allowing a storage capacitance associated with the third transistor to be used during a read data operation instead of requiring a stacked capacitor storage capacitance.

* * * * *

UNITED STATES PATENT AND TRADEMARK OFFICE
CERTIFICATE OF CORRECTION

PATENT NO.     : 6,804,142 B2
DATED          : October 12, 2004
INVENTOR(S)    : Forbes It is certified that error appears in the above-identified patent and that said Letters Patent is hereby corrected as shown below:

Title page,
Item [56], References Cited, U.S. PATENT DOCUMENTS, below "4,999,811" insert -- 5,006,909    *    4/1991  Kosa  257/302 -- below "5,280,205" insert -- 5,291,438  *   3/1994 Witek et al.    365/149 -- below "5,973,356"
Insert --     6,077,745 *    6/2000       Burns et al.           438/270
              6,204,115 *    3/2001       Cho                    438/270
              6,246,083 *    6/2001       Noble                  257/296
              6,282,115 *    8/2001       Furukawa et al.        365/149
              6,316,309 *   11/2001       Holmes et al.          438/246
              6,440,801 *    8/2002       Furukawa et al.        438/272
              6,566,682 *    5/2003       Forbes                 257/302 --.
OTHER PUBLICATIONS, "Adler, E., et al.," reference, delete "Developmen" and insert -- Development -- therefor. "Kautschneider, F.," reference, delete "Micoelectron" and insert -- Microelectron --, therefor. "Ohsawa, T., et al.," reference, delete "Dram" and insert -- 9, DRAM --, therefor. "Rabaey, Jan M.," reference, insert -- " -- before "Digital". Rabaey, Jan M.," reference, after "perspective" insert -- " --.

Column 2,
Lines 47-48. delete "Electrochemicals" and insert -- Electrochemical --, therefor.

Column 3,
Line 15, delete "DRAMS" and insert -- DRAMs --, therefor.
Line 44, delete "el" and insert -- et --, therefor.

Column 9,
Line 66, delete "an" and insert -- a --, therefor.

Column 10,
Line 50, delete "an" and insert -- a --, therefor.

UNITED STATES PATENT AND TRADEMARK OFFICE
CERTIFICATE OF CORRECTION

PATENT NO. : 6,804,142 B2
DATED : October 12, 2004
INVENTOR(S) : Forbes

It is certified that error appears in the above-identified patent and that said Letters Patent is hereby corrected as shown below:

Column 13,
Line 35, delete "an" and insert -- a --, therefor.

Signed and Sealed this

Nineteenth Day of April, 2005

JON W. DUDAS
*Director of the United States Patent and Trademark Office*